(12) United States Patent
Kunikiyo

(10) Patent No.: US 6,737,944 B2
(45) Date of Patent: May 18, 2004

(54) ACTIVE INDUCTOR

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 86 days.

(21) Appl. No.: 09/805,925

(22) Filed: Mar. 15, 2001

(65) Prior Publication Data

US 2002/0047760 A1 Apr. 25, 2002

(30) Foreign Application Priority Data

Sep. 4, 2000 (JP) ........................................ 2000-266900

(51) Int. Cl.$^7$ ............................................. H03H 11/00
(52) U.S. Cl. ................................. 333/214; 333/215
(58) Field of Search ................................. 333/214, 215

(56) References Cited

U.S. PATENT DOCUMENTS 5,227,681 A 7/1993 Koyama et al. ........ 330/300 X
5,384,501 A 1/1995 Koyama et al. ........ 330/300 X

FOREIGN PATENT DOCUMENTS

DE 691 31 531 3/2000

OTHER PUBLICATIONS

Ko et al., "Low Power, Tunable Active Inductor and its Applications to Monolithic VCO and BPF," 1997, IEEE MTT-S Digest, pp. 929-932.*
Millman, "Microelectronics," 1979, McGraw-Hill, New York, NY, pp. 237 & 254.*

* cited by examiner

Primary Examiner—Robert Pascal
Assistant Examiner—Kimberly Glenn
(74) Attorney, Agent, or Firm—Oblon, Spivak, McClelland, Maier & Neustadt, P.C.

(57) ABSTRACT

A transistor M1 has its drain connected to a source of a transistor M2 through a capacitor $Cc_3$. A series connection of a resistor R and a capacitor $Cc_1$ is provided between a source of the transistor M1 and a gate of the transistor M2. The transistor M1 has its gate connected to a drain of the transistor M2 through a capacitor $Cc_2$. Appropriate dc bias potentials $P_1$, $P_2$ and $P_3$ are provided for the drain of the transistor M2, the gate and the drain of the transistor M1, respectively, so that an active inductor is obtained between the gate and the source of the transistor M2.

6 Claims, 15 Drawing Sheets

F I G. 6
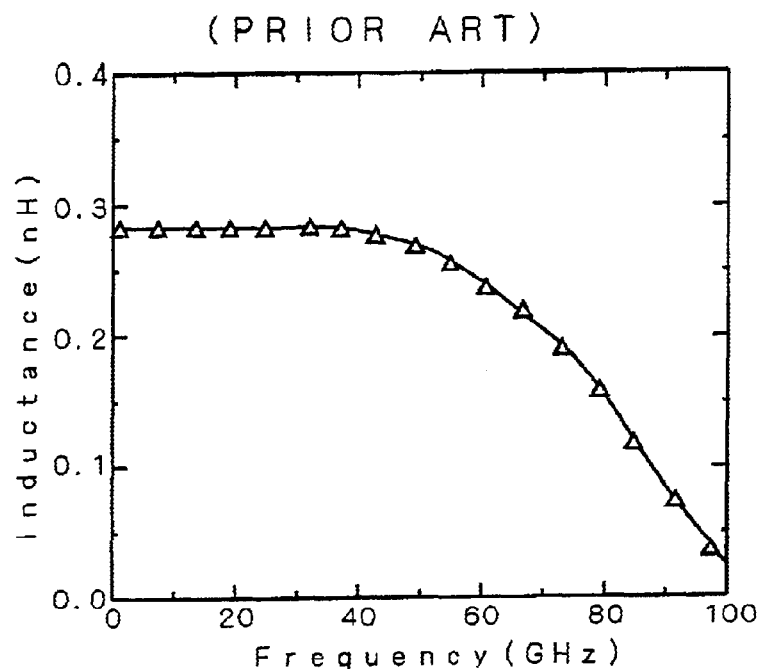
(PRIOR ART)

F I G. 10
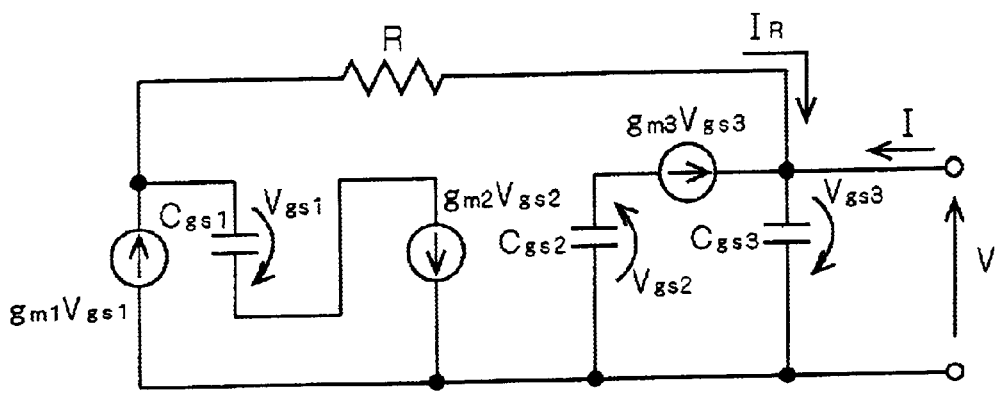
F I G. 11
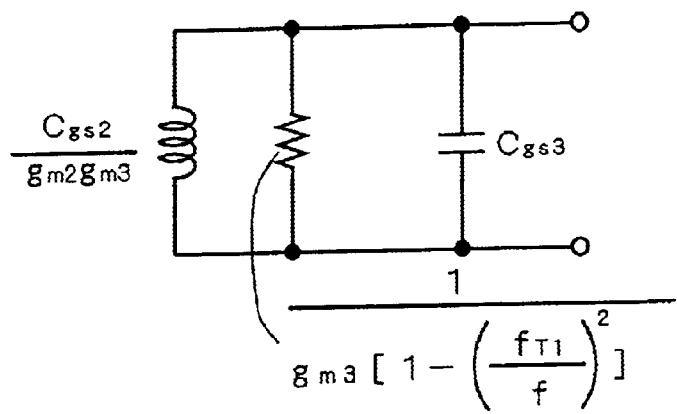

F I G. 12
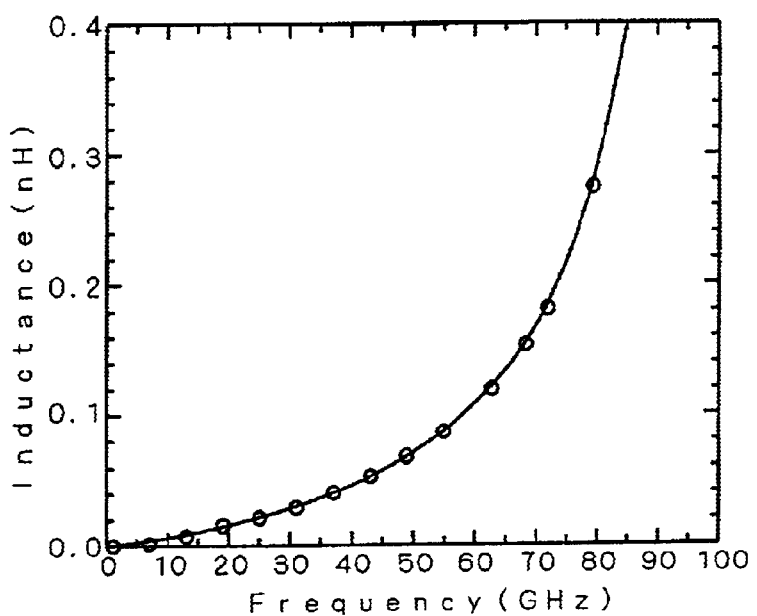
F I G. 13
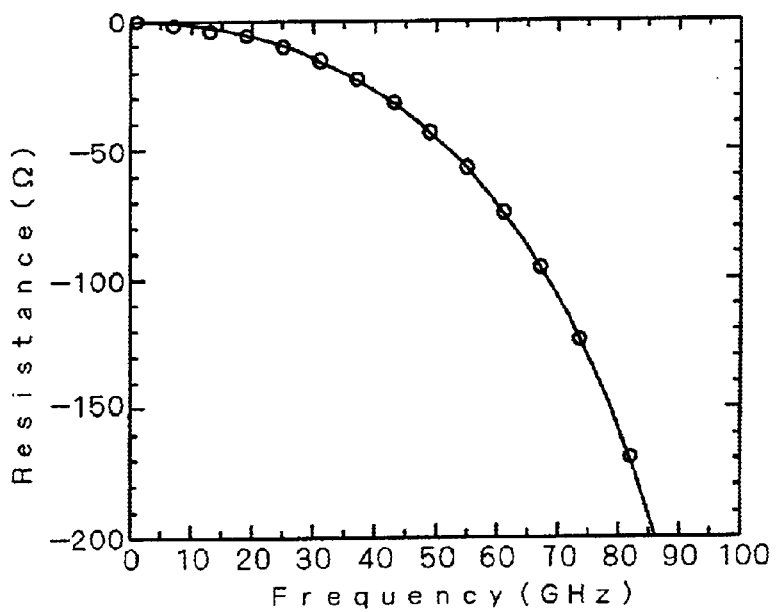

F I G. 1 4
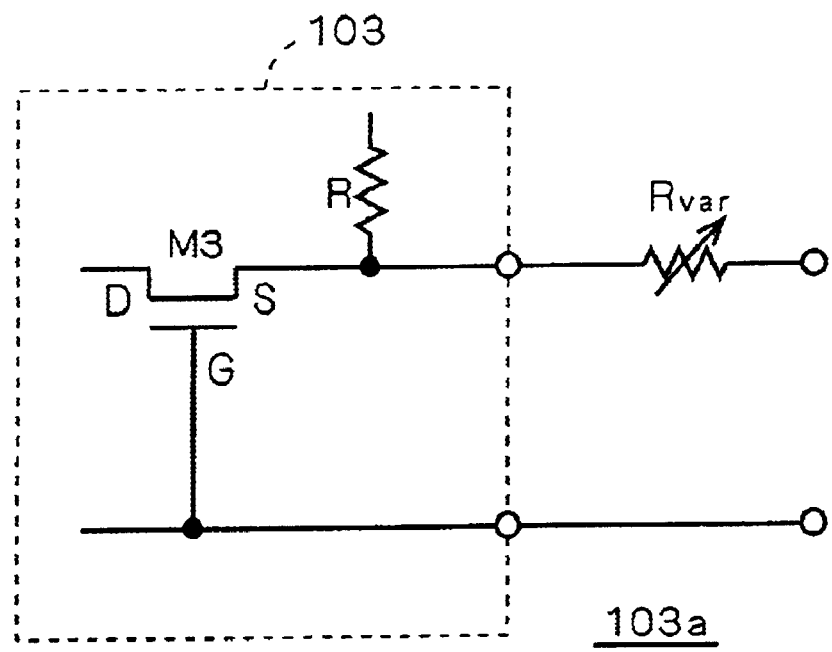

ACTIVE INDUCTOR

BACKGROUND OF THE INVENTION

1. Field of the Invention

This invention relates to an active inductor, and more particularly to an active inductor in which a field effect transistor is employed.

2. Description of the Background Art

In monolithic microwave integrated circuits (hereinafter referred to as "MMICs"), it is required to obtain an impedance matching between circuits and to improve the bandwidth of circuits. To meet these requirements, a capacitor and an inductor are used in MMICs. As an inductor for use in MMICs, a spiral inductor has been employed in many cases which is made of a metal conductor wound in a spiral manner on a dielectric substrate.

A spiral inductor has a simple construction, whereas its configuration has to be enlarged in order to obtain a large inductance. Thus, a spiral inductor practically tends to occupy a large area. Moreover, there have been problems in that a resistance component is high, resulting in an increase in power consumption and that cross-talk occurs between a spiral inductor and a peripheral circuit thereof.

In order to solve the above noted problems encountered in a spiral inductor, there have been proposals for an active inductor using a transistor which is an active element. Advantageously, an active inductor can be miniaturized compared to a spiral inductor and, besides, a resistive component is low, which allows reduction in power consumption. Further, cross-talk rarely occurs between an active inductor and a peripheral circuit thereof. For these characteristics, an active inductor is suitable for MMICs.

Conventionally, combination of a gyrator in a four-port network circuit and a capacitor has been proposed as an active inductor, for a gyrator has a function of converting an impedance. In particular, a field effect transistor has a high input impedance, which is therefore suitable for constituting a gyrator. The technique for forming an active inductor by a capacitor and a gyrator comprising a field effect transistor is disclosed, for example, in Japanese Patent Application Laid-Open No. 4-233312.

On the other hand, another type of active inductor has also been proposed which is not so constructed as to convert an impedance of a capacitor using a gyrator. FIG. 23 is a circuit diagram showing a construction of an active inductor 200 which is introduced, for example, in "Broad-Band Monolithic Active Inductor and Its Application to Miniaturized Wide-Band Amplifiers", Hara et al., IEEE Transactions on Microwave Theory and Techniques, MTT-36, No. 12, pp.1920–1924 (December 1988). Transistors M1 and M2 are both field effect transistors, each having a drain, a gate and a source represented as D, G and S, respectively. The source of the transistor M1 is connected to the gate of the transistor M2, while the drain of the transistor M1 is connected to the source of the transistor M2. A resistor R is connected between the gate of the transistor M1 and the drain of the transistor M2, and an impedance between the drain and gate of the transistor M2 acts as an inductor. A bias circuit for operating the transistors M1 and M2 is not illustrated in the figure.

Both of the field effect transistors M1 and M2 can be represented as an equivalent circuit as shown in FIG. 24. Specifically, when a parasitic capacitor $C_{gs}$ is provided between the source and the gate and the gate-source voltage is $V_{gs}$, operating characteristics of the transistors M1 and M2 can be approximated by operations of the equivalent circuit having a current source for flowing current $g_m V_{gs}$ from the drain to the source ($g_m > 0$: transconductance). For simplification, symbols in the circuit also indicate values of an element, potential or current which they represent. The expression "approximate a circuit by its equivalent circuit", which will be used hereinafter, represents approximation of operations of a circuit by operations of its equivalent circuit.

Employing the equivalent circuit shown in FIG. 24, numerical subscripts 1 and 2 are added to the parasitic capacitor $C_{gs}$, the transconductance $g_m$, the gate-source voltage $V_{gs}$, respectively, so as to make clear that they are elements in the equivalent circuit of the transistors M1 and M2. This allows the active inductor 200 to be approximated by the equivalent circuit shown in FIG. 25.

The drain-gate voltage of the transistor M2 is indicated by V, and current flowing in the active inductor shown in FIG. 23 is indicated by I (let positive a direction the current flowing into a junction between the drain of the transistor M2 and the resistor R). An angular frequency of the voltage V is indicated by $\omega$, and an imaginary unit $(-1)^{1/2}$ is indicated by j. Then, admittances of the parasitic capacitors $C_{gs1}$ and $C_{gs2}$ are indicated by $j\omega C_{gs1}$ and $j\omega C_{gs2}$, respectively.

Therefore, an impedance of the active inductor shown in FIG. 23 is expressed as follows:

$$Z = \frac{V}{I} \tag{1}$$

$$= \frac{1}{1+\left(\frac{\omega C_{gs2}}{g_{m2}}\right)^2} \cdot \frac{1+j\omega C_{gs1} R}{g_{m1}+j\omega\left[C_{gs1}-\left(\frac{g_{m1}}{g_{m2}}\right)C_{gs2}+\left(\frac{\omega C_{gs2}}{g_{m2}}\right)C_{gs1}\right]}$$

In the case that the transistors M1 and M2 have the same characteristics, equations $C_{gs1}=C_{gs2}=C$ and $g_{m1}=g_{m2}=g$ are satisfied. Thus, the equation (1) is expressed as follows:

$$Z = \frac{1}{1+\left(\frac{\omega}{\omega_T}\right)^2} \cdot \frac{\frac{1}{g}+j\omega\frac{CR}{g}}{1+j\left(\frac{\omega}{\omega_T}\right)^3} \tag{2}$$

where $\omega_T = g/C$.

The common denominator of the right term on the right side of the equation (2) is $1+j(\omega/\omega_T)^3$. Under the condition where:

$$\left(\frac{\omega}{\omega_T}\right)^3 \ll 1 \tag{3}$$

approximation can be obtained as follows:

$$Z \approx \frac{\frac{1}{g}+j\omega\frac{CR}{g}}{1+\left(\frac{\omega}{\omega_T}\right)^2} \tag{4}$$

Moreover, under the condition where:

$$\left(\frac{\omega}{\omega_T}\right)^2 \ll 1 \quad (5)$$

the condition of the expression (3) is also satisfied, and the expression (4) can be approximated as follows:

$$Z \approx \frac{1}{g} + j\omega\left(\frac{CR}{g}\right) \quad (6)$$

Therefore, under the condition of the expression (5), the active inductor shown in FIG. 23 can be approximated by a circuit having a resistance component (1/g) connected in series to an ideal inductor CR/g as shown in FIG. 26.

Even when employing the equivalent circuit shown in FIG. 24 in which a resistive component in the transistors M1 and M2 is ignored, a series resistive component exists as shown in the expression (6). This shows that loss is in principle unavoidable in the active inductor 200.

SUMMARY OF THE INVENTION

A first aspect of the present invention is directed to an active inductor comprising first and second field effect transistors, each having a source, a gate and a drain, wherein the drain of the first field effect transistor is connected to the source of the second field effect transistor, the gate of the first field effect transistor is connected to the drain of the second field effect transistor with no active element interposed therebetween. The active inductor further comprises a feedback path provided between the source of the first field effect transistor and the gate of the second field effect transistor, wherein the gate and the source of the second field effect transistor serve as two ports of the active inductor.

A second aspect of the present invention is directed to an active inductor comprising first to third field effect transistors, each having a source, a gate and a drain, wherein the drain of the first field effect transistor is connected to the source of the second field effect transistor and the gate of the third field effect transistor, the gate of the first field effect transistor is connected to the drain of the second field effect transistor, the gate of the second field effect transistor is connected to the drain of the third field effect transistor. The active inductor further comprises a feedback path provided between the source of the first field effect transistor and the source of the third field effect transistor, the gate and the source of the third field effect transistor serve as two ports of the active inductor.

A third aspect of the present invention is directed to an active inductor comprising first to fourth field effect transistors, each having a source, a gate and a drain, wherein the drain of the first field effect transistor is connected to the source of the second field effect transistor, the gate of the third field effect transistor and the gate of the fourth field effect transistor, the gate of the first field effect transistor is connected to the drain of the second field effect transistor, the gate of the second field effect transistor is connected to the drain of the third field effect transistor, the source of the third field effect transistor is connected to the source of the fourth field effect transistor. The active inductor further comprises a feedback path provided between the source of the first field effect transistor and the drain of the fourth field effect transistor, wherein the source and the drain of the fourth field effect transistor are set at the same potential, current into a junction between the drain of the fourth field effect transistor and the feedback path and current into a junction between the source of the fourth field effect transistor and the source of the third field effect transistor are set to flow independently of each other, the gate and the drain of the fourth field effect transistor serve as two ports of the active inductor.

Preferably, according to a fourth aspect of the present invention, the active inductor of the second or third aspect further comprises a resistor connected in series to the two ports of the inductor.

Preferably, according to a fifth aspect of the present invention, the active inductor of any one of the first to fourth aspects further comprises a field effect transistor for feedback provided on the feedback path, having a source connected to the source of the first field effect transistor, a gate and a drain connected to each other and to one of the two ports of the inductor.

As has been described, the active inductor according to the first to third aspects reduce the series resistance component of the active inductor. Further, as in the active inductor according to the fifth aspect, a field effect transistor for feedback having its gate and drain connected to each other may be provided on the feedback path.

Since a negative resistance is generated particularly in the active inductor according to the second and third aspects, a resistance can be connected in series from the outside, thereby controlling the series resistance as in the active inductor according to the fourth aspect.

Particularly in the active inductor according to the third aspect, at least one of the third and fourth field effect transistors is controlled, so that the characteristics, e.g., the band, is controlled.

An object of the present invention is to provide an active inductor with minimized loss. Another object of the present invention is to provide an active inductor with a wide range, i.e., a broad band, which is a predetermined range which an inductance falls within.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a graph showing an inductance component of an active inductor according to the background art;

FIGS. 10 and 11 are circuit diagrams showing an equivalent circuit of the active inductor according to the second preferred embodiment;

FIG. 12 is a graph showing an inductance component of the active inductor according to the second preferred embodiment;

FIG. 13 is a graph showing a series resistance component of the active inductor according to the second preferred embodiment;

FIG. 14 is a circuit diagram showing a construction of an active inductor according to a modification of the second preferred embodiment;

DESCRIPTION OF THE PREFERRED EMBODIMENTS

First Preferred Embodiment

Figure 1:
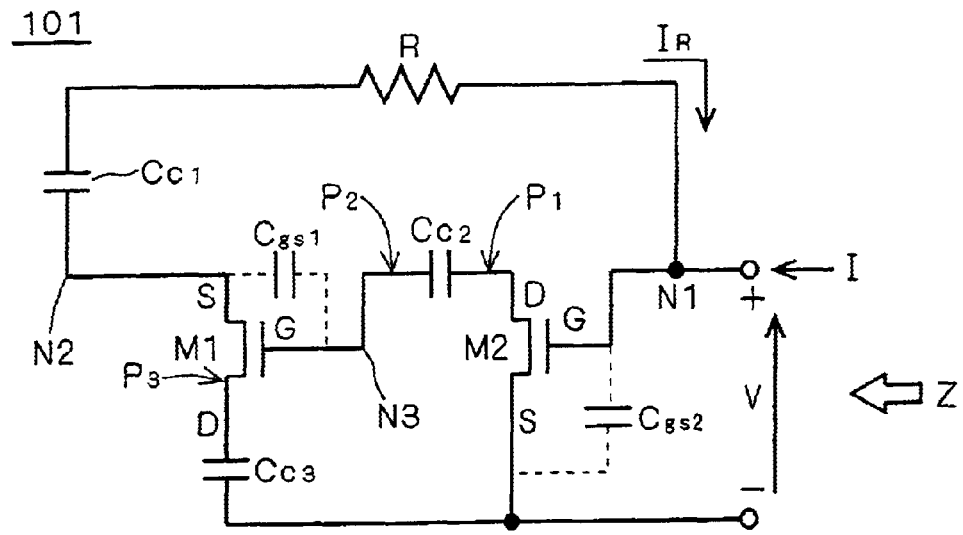
FIG. 1 is a circuit diagram showing a construction of an active inductor according to a first preferred embodiment of the present invention.

FIG. 1 is a circuit diagram showing a construction of an active inductor 101 according to a first preferred embodiment of the present invention. Both in field effect transistors M1 and M2, symbols D, G and S represent drain, gate and source, respectively. In the present invention, a source is connected to a body (back gate) of a transistor.

The drain of the transistor M1 is connected to the source of the transistor M2 through a capacitor $Cc_3$. A series connection of a resistor R and a capacitor $Cc_1$, is provided between the source of the transistor M1 and the gate of the transistor M2. The gate of the transistor M1 and the drain of the transistor M2 are connected through a capacitor $Cc_2$. The drain of the transistor M2, the gate and the drain of the transistor M1 are provided with appropriate dc bias potentials $P_1$, $P_2$ and $P_3$, respectively. Accordingly, an active inductor is obtained between the gate and the source of the transistor M2.

Though not illustrated, such bias potentials can be supplied from the outside through an inductor having an inductance which is set large so as to reduce admittance thereof to such an extent that can be ignored in an analysis of the circuit to be presented below. The capacitors $Cc_1$, $Cc_2$ and $Cc_3$ are provided, for example, for the purpose of blocking direct current component to avoid collision of the bias potentials with one another. Therefore, the capacitors $Cc_1$, $Cc_2$ and $Cc_3$ can be set in high values so as to reduce their impedances to such an extent that can be ignored in an analysis of the circuit to be presented below.

Figure 2:
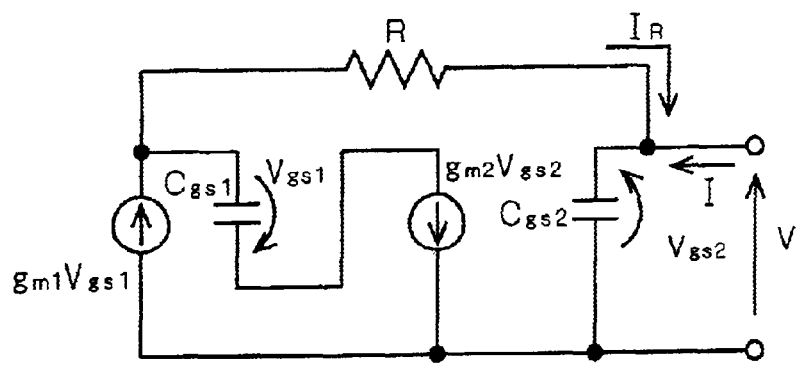
FIGS. 2 and 3 are circuit diagrams showing an equivalent circuit of the active inductor according to the first preferred embodiment.
Figure 24:
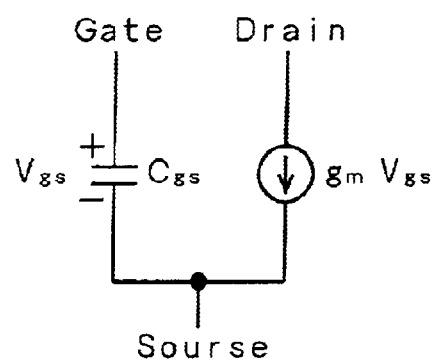
FIG. 24 is a circuit diagram showing an equivalent circuit of a field effect transistor.
Figure 25:
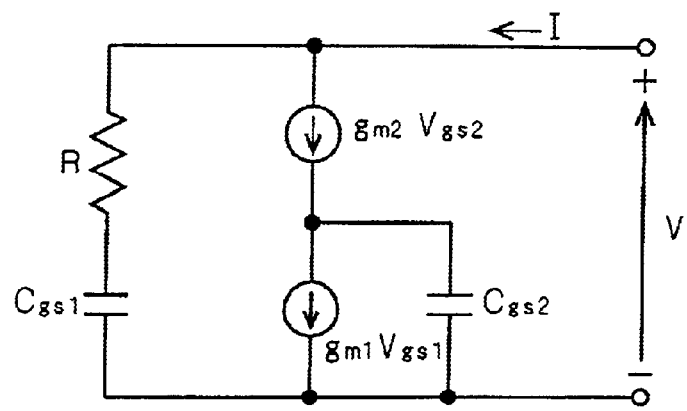
FIGS. 25 and 26 are circuit diagrams of an equivalent circuit showing the background art.
Figure 26:
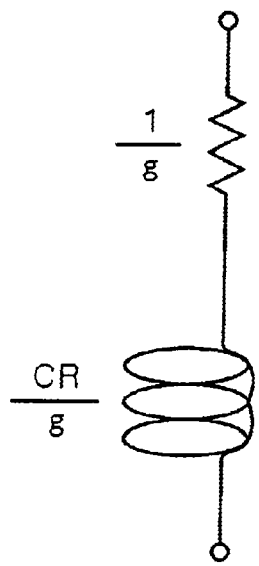

Now, current flowing in the active inductor 101 is indicated by I (let positive a direction the current flowing into a junction between the gate of the transistor M2 and the resistor R). In a similar manner to the background art, the transistors M1 and M2 have transconductances of $g_{m1}$ and $g_{m2}$, respectively, and capacitors of the transistors M1 and M2 which parasite between the source and the gate are $C_{gs1}$ and $C_{gs2}$, respectively, with the equivalent circuit shown in FIG. 24 employed. Then, an equivalent circuit of the active inductor 101 is shown in FIG. 2.

The gate voltage of the transistor M2 is indicated by V relative to the source of the transistor M2, and its angular frequency is indicated by ω (=2πf: f represents frequency). The equation $V=V_{gs2}$ is satisfied. Thus, when current flowing from the source of the transistor M1 into the resistor R is indicated by $I_R$, the following equations are satisfied:

$$I+I_R=j\omega C_{gs2}V$$

$$I_R=(g_{m1}+j\omega C_{gs1})V_{gs1} \quad (7)$$

$$j\omega C_{gs1}V_{gs1}=-g_{m2}V$$

where the first to third expressions are satisfied at nodes N1 to N3 shown in FIG. 1, respectively. Accordingly, an admittance between the gate and the source of the transistor M2 viewed from the outside is expressed as follows:

$$Y = j\omega C_{gs2} + \frac{g_{m1}g_{m2}}{j\omega C_{gs1}} + g_{m2} \quad (8)$$

Figure 3:
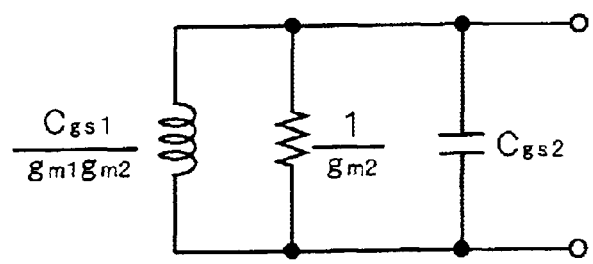

That is, the equivalent circuit of the active inductor 101 can be represented as a parallel connection of an inductor having a value of $C_{gs1}/(g_{m1}g_{m2})$, a resistor having a value of $g_{m2}^{-1}$ and a capacitor having a value of $C_{gs2}$ as shown in FIG. 3, without depending upon a resistance value R. An antiresonance frequency of a resonance circuit formed by the parallel connection of the inductor having the value of $C_{gs1}/(g_{m1}g_{m2})$ and the capacitor having the value of $C_{gs2}$ is indicated by $f_{T1}$. When the equation:

$$f_{T1} = \frac{1}{2\pi}\sqrt{\frac{g_{m1}g_{m2}}{C_{gs1}C_{gs2}}} \quad (9)$$

is introduced, an impedance between the gate and the source of the transistor M2 viewed from the outside is expressed as follows, taking the reciprocal of the expression (8):

$$Z = \frac{1}{g_{m2}} \cdot \frac{j\cdot 2\pi f\left(\frac{C_{gs1}}{g_{m1}}\right)}{\left[1-\left(\frac{f}{f_{T1}}\right)^2\right]+j\cdot 2\pi f\left(\frac{C_{gs1}}{g_{m1}}\right)} \quad (10)$$

Figure 4:
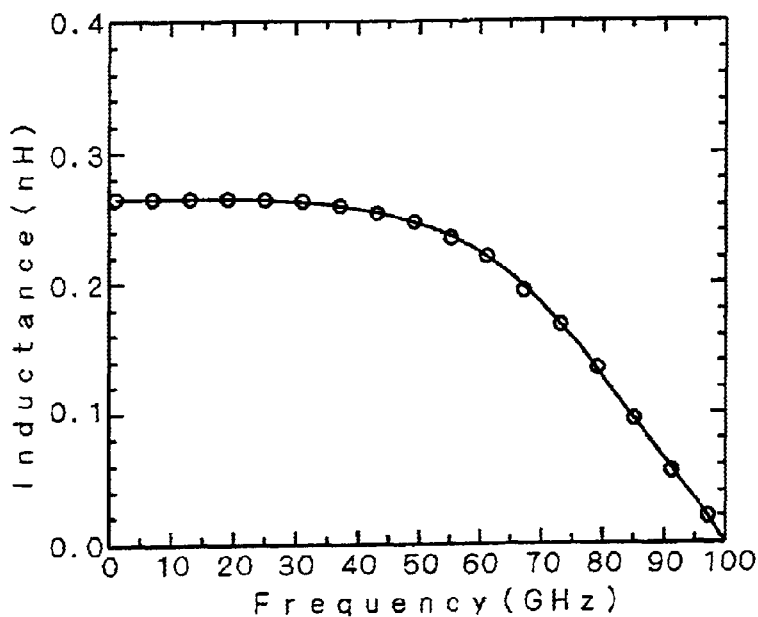
FIG. 4 is a graph showing an inductance component of the active inductor according to the first preferred embodiment.
Figure 5:
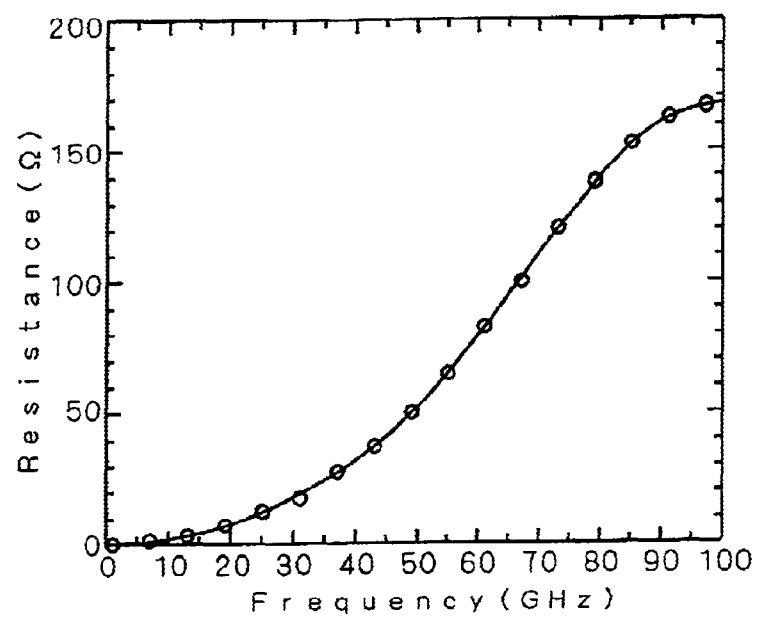
FIG. 5 is a graph showing a series resistance component of the active inductor according to the first preferred embodiment.

FIGS. 4 and 5 are graphs showing the results of simulation performed based on the expression (10) and indicating an inductance component and a series resistance component of the active inductor 101, respectively. Here, both transconductances $g_{m1}$ and $g_{m2}$ of the transistors M1 and M2 are set to 600 mS, and both parasitic capacitors $C_{gs1}$ and $C_{gs2}$ are set to 9.6 fF. In this case, an anti-resonance frequency $f_T$ is approximately 100 GHz. For instance, the gate length and gate width are 0.1 μm and 10 μm, respectively, and a gate insulation film has a thickness equivalent to 1.8 nm of a silicon oxide film in respect to the dielectric constant.

FIG. 4 shows that, at a frequency below the anti-resonance frequency $f_T$, the inductance decreases as the frequency increases, and a frequency range in which an inductance value successively varied from an inductance value at 1 GHz ($C_{gs1}/(g_{m1}g_{m2}) \approx 0.27$ nH), falls within a variation of ±10% of the inductance value at 1 GHz, is approximately 53 GHz.

Figure 7:
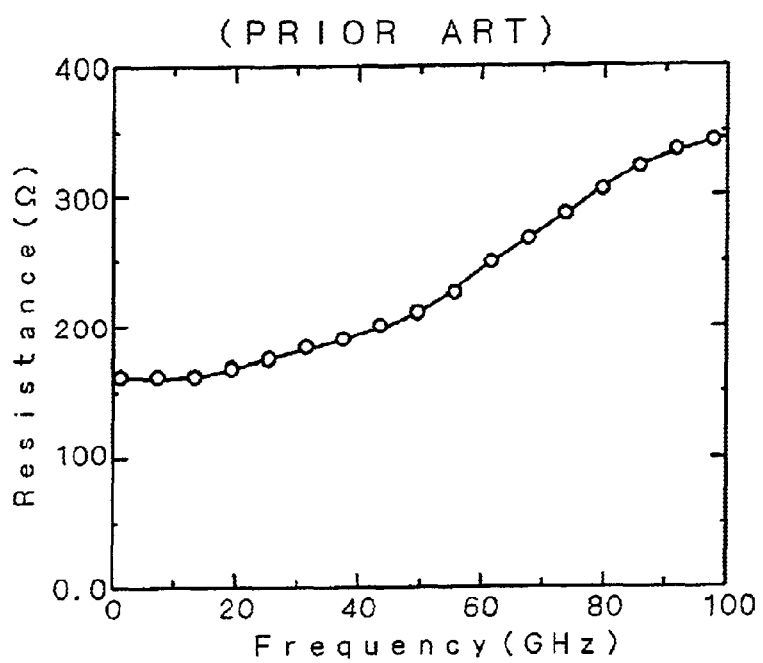
FIG. 7 is a graph showing a series resistance component of the active inductor according to the background art.
Figure 23:
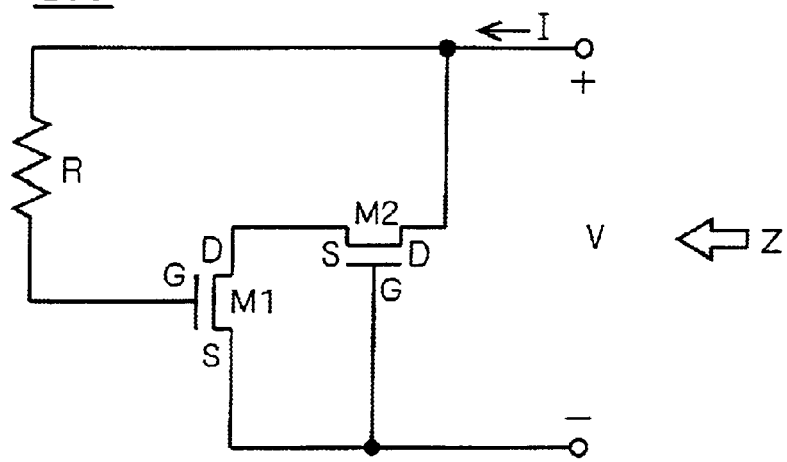
FIG. 23 is a circuit diagram showing the background art.

FIGS. 6 and 7 show the results of simulation performed based on the equation (2) expressing the characteristics of the active inductor 200 shown in FIG. 23 using the transistors M1 and M2 having specifications described above. FIGS. 6 and 7 show an inductance component and a resistance component, respectively. A resistance value R is set in 180 Ω.

An inductance value at 1 GHz in the Background Art is determined by the expression (6) as $CR/g \approx 0.29$ nH, which is nearly equal to that in the present embodiment. A frequency range in which an inductance value falls within a variation of ±10% of the inductance value at 1 GHz is 56 GHz. Therefore, with respect to the characteristics of an inductor component, it is apparent that the present embodiment obtains performance substantially equal to that of the background art.

However, as shown in FIG. 7, the series resistance component of the active inductor 200 takes a value equal to or higher than the series resistance component $1/g \approx 167$ Ω obtained by the expression (6). On the other hand, the series resistance component of the active inductor shown in the present embodiment takes a value equal to or lower than $1/g_{m2} \approx 167$ Ω as shown in FIG. 5. Therefore, it is possible to obtain an active inductor with minimized loss.

Though the resistor R is provided on a feedback path between the source of the transistor M1 and the gate of the transistor M2 in the present embodiment, the resistance value R does not affect the operation of the active inductor as shown in the expression (8). Thus, it is an advantage that the resistor R is designed separately from the specifications of the transistors M1 and M2. The resistance value R may be zero. Further, the resistor R may generally be replaced with another two-port element, e.g., a capacitive element and/or an inductive element.

Figure 8:
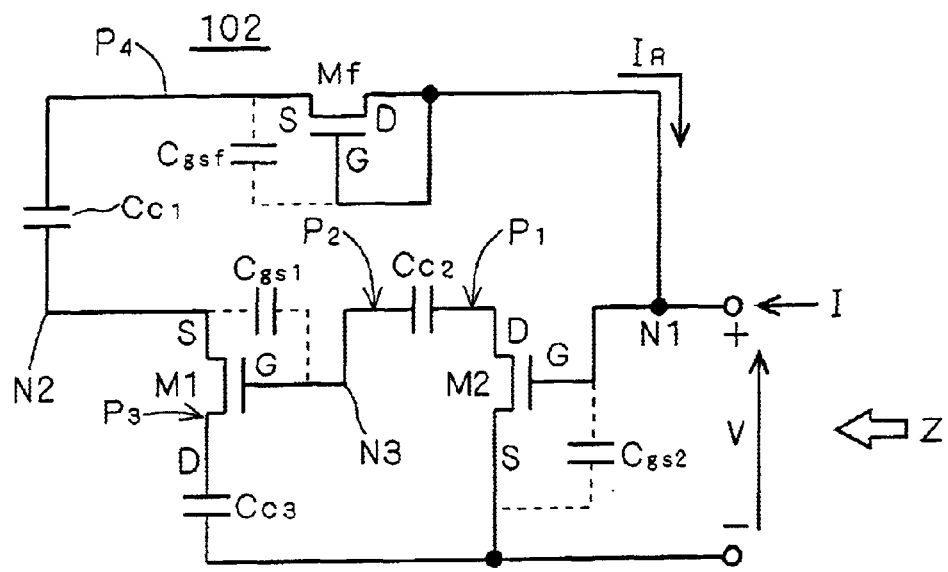
FIG. 8 is a circuit diagram showing a construction of an active inductor according to a modification of the first preferred embodiment.

FIG. 8 is a circuit diagram showing a construction of an active inductor 102 according to a modification of the present embodiment. This modification applies to the case where a field effect transistor Mf having its drain and gate both connected to the gate of the transistor M2 and its source connected to the source of the transistor M1 is employed as a two-port element for replacing the resistor R in the active inductor 101. In this case, the source-drain current of the transistor M1 is determined in the same fashion as that shown in FIG. 1. The source-gate voltage of the transistor Mf is determined in such a manner that current equal to the source-drain current of the transistor M1 becomes equal to the sum of the source-drain current of the transistor Mf and current flowing in a parasitic capacitor $C_{gsf}$ between the source and the gate of the transistor Mf. Here, the source of the transistor Mf is provided with an appropriate dc bias potential $P_4$.

Second Preferred Embodiment

Figure 9:
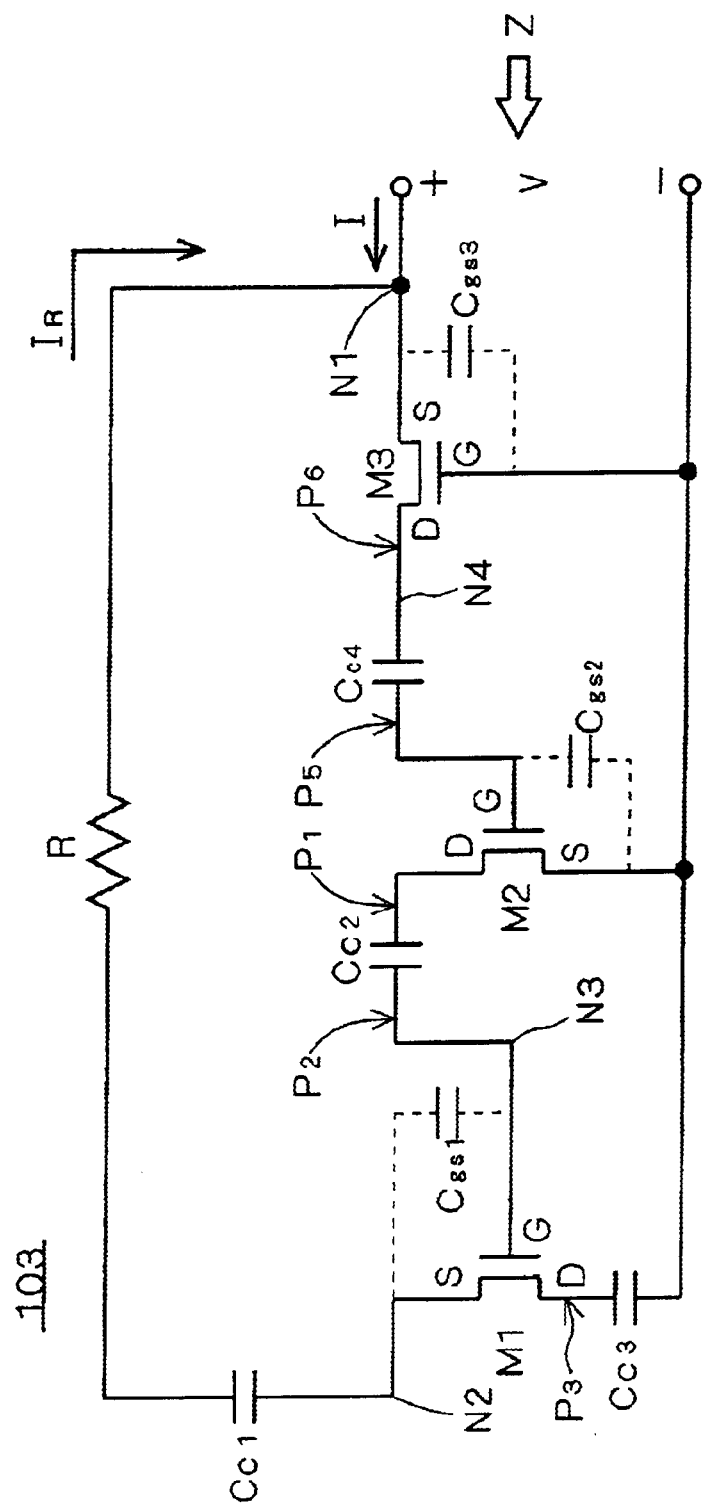
FIG. 9 is a circuit diagram showing a construction of an active inductor according to a second preferred embodiment of the present invention.

FIG. 9 is a circuit diagram showing a construction of an active inductor 103 according to the second preferred embodiment of the present invention. The active inductor 103 includes a field effect transistor M3 added between the gate of the transistor M2 and the resistor R of the active inductor 101 shown in FIG. 1. More specifically, the drain of the transistor M3 is connected to the gate of the transistor M2 through a capacitor $Cc_4$ which is provided, for example, for the purpose of interrupting direct current to avoid collision of the bias potentials with one another. The source of the transistor M3 is connected to the source of the transistor M1 through the series connection of the capacitor $Cc_1$ and the resistor R. The gate of the transistor M3 is connected to the source of the transistor M2.

Appropriate dc bias potentials $P_5$ and $P_6$ are respectively provided for two ends of the capacitor $Cc_4$, i.e., the gate of the transistor M2 and the drain of the transistor M3, so that an active inductor is obtained between the gate and the source of the transistor M3.

Current flowing in the active inductor 103 is indicated by I (let positive a direction the current flowing into a junction between the gate of the transistor M3 and the resistor R). The transistor M3 has a transconductance of $g_{m3}$, and a capacitor which parasites between the source and the gate of the transistor M3 is indicated by $C_{gs3}$, with the equivalent circuit shown in FIG. 24 employed. Then, an equivalent circuit of the active inductor 103 is shown in FIG. 10.

The source voltage of the transistor M3 is indicated by V relative to the gate of the transistor M3, and its angular frequency is indicated by ω (=2πf: f represents frequency). The equation $V = -V_{gs3}$ is satisfied. Thus, when current flowing from the source of the transistor M1 into the resistance R is indicated by $I_R$, the following equations hold:

$$I + I_R - (g_{m3} + j\omega C_{gs3})V = 0$$

$$I_R = (g_{m1} + j\omega C_{gs1})V_{gs1}$$

$$j\omega C_{gs1}V_{gs1} = -g_{m2}V_{gs2} \quad (11)$$

$$j\omega C_{gs2}V_{gs2} = g_{m3}V$$

where the first to fourth equations are satisfied at nodes N1 to N4 shown in FIG. 9, respectively. Accordingly, an admittance between the gate and the source of the transistor M3 viewed from the outside is expressed as follows:

$$Y = j\omega C_{gs3} + \frac{g_{m2}g_{m3}}{j\omega C_{gs2}} + g_{m3}\left[1 - \frac{1}{\omega^2} \cdot \frac{g_{m1}g_{m2}}{C_{gs1}C_{gs2}}\right] \quad (12)$$

That is, the equivalent circuit of the active inductor 103 can be represented as a parallel connection of an inductor having a value of $C_{gs2}/(g_{m2}g_{m3})$, a resistor having a value which will be described below and a capacitor having a value of $C_{gs3}$, without depending upon a resistance value R. An anti-resonance frequency of a resonance circuit formed by the parallel connection of the inductor having the value of $C_{gs2}/(g_{m2}g_{m3})$ and the capacitor having the value of $C_{gs3}$ is indicated by $f_{T2}$. When the equation:

$$f_{T2} = \frac{1}{2\pi}\sqrt{\frac{g_{m2}g_{m3}}{C_{gs2}C_{gs3}}} \quad (13)$$

is introduced, the value of the resistor to be connected in parallel is indicated by $g_{m3}^{-1}[1-(f_{T1}/f)^2]^{-1}$. FIG. 11 shows the equivalent circuit of the active inductor 103 which is obtained based on the expressions (12) and (13).

Taking the reciprocal of the expression (12), an impedance between the gate and the source of the transistor M3 viewed from the outside is expressed as follows:

$$Z = \frac{1}{g_{m3}} \cdot \frac{j \cdot 2\pi f\left(\frac{C_{gs2}}{g_{m2}}\right)}{\left[1 - \left(\frac{f}{f_{T2}}\right)^2\right] + j \cdot 2\pi f\left(\frac{C_{gs2}}{g_{m2}}\right)\left[1 - \left(\frac{f_{T1}}{f}\right)^2\right]} \quad (14)$$

FIGS. 12 and 13 are graphs showing the results of simulation performed based on the expression (14) and indicating an inductance component and a serial resistance component of the active inductor 103, respectively. Here, transconductances $g_{m1}$, $g_{m2}$ and $g_{m3}$ of the transistors M1 to M3 are set to 600 mS, and parasitic capacitors $C_{gs1}$, $C_{gs2}$ and $C_{gs3}$ are set to 9.6 fF. In this case, anti-resonance frequencies $f_{T1}$ and $f_{T2}$ are approximately 100 GHz. For instance, the gate length and gate width are 0.1 μm and 10 μm, respectively, and a gate insulation film has a thickness equivalent to 1.8 nm of a silicon oxide film in respect to the dielectric constant.

As shown in FIGS. 12 and 13 and apparent from the expression (14), at a frequency below the anti-resonance frequencies $f_{T1}$ and $f_{T2}$, the inductance component increases as the frequency increases. The resistance component has a negative value, the absolute value of which increases as the frequency increases.

Since the value of the resistor connected in parallel to the inductor in the equivalent circuit is very low at a very low frequency, it is not possible to increase the bandwidth of the inductance component of the active inductor 103. On the other hand, at a frequency below the anti-resonance frequency, the series resistance component also has a negative value. Accordingly, it is possible to minimize loss by connecting another resistor in series from the outside. FIG. 14 exemplifies a circuit in which a variable resistor $R_{var}$ is connected in series to the active inductor 103. Such a series connection of the active inductor 103 and the variable resistor $R_{var}$ can also be considered as an active inductor 103a.

As apparent from the expression (14), the resistance value R does not affect the operation of the active inductor also in the present embodiment. Thus, similarly to the first preferred embodiment, the resistor R may be replaced on the feedback path provided between the sources of the transistors M1 and M3 with another two-port element, e.g., a capacitive element and/or an inductive element, and further, with the transistor Mf as in the modification shown in FIG. 8.

Third Preferred Embodiment

Figure 15:
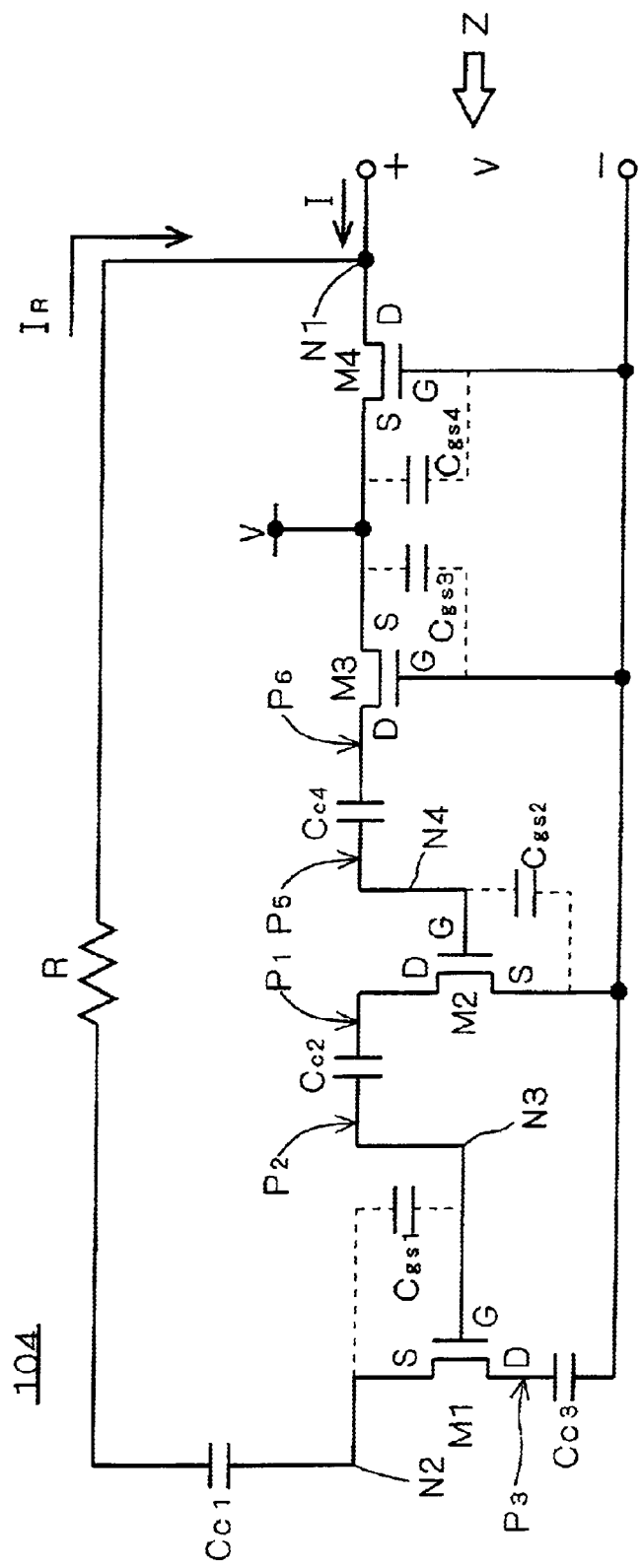
FIG. 15 is a circuit diagram showing a construction of an active inductor according to a third preferred embodiment of the present invention.

FIG. 15 is a circuit diagram showing a construction of an active inductor 104 according to a third preferred embodiment of the present invention. The active inductor 104 includes a field effect transistor M4 added between the source of the transistor M3 and the resistor R of the active inductor 103 shown in FIG. 9. More specifically, the source of the transistor M4 is connected to the source of the transistor M3, and the drain of the transistor M4 is connected to the source of the transistor M1 through the series connection of the capacitor $C_{c1}$, and the resistor R. The gate of the transistor M4 is connected to the source of the transistor M2.

The sources of the transistors M2 and M4 are fixed at the same potential as the drain of the transistor M4, so that an active inductor is obtained between the gate and the drain of the transistor M4. Current into a junction between the drain of the transistor M4 and the resistor R and current into a junction between the source of the transistor M4 and the source of the transistor M3 are set to flow independently of each other.

Figure 16:
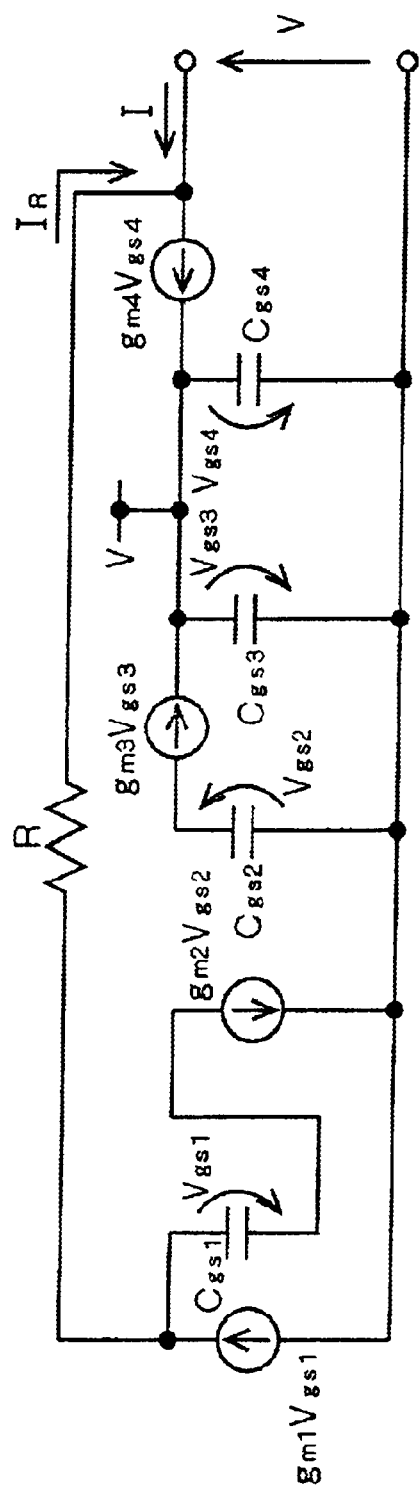
FIGS. 16 and 17 are circuit diagrams showing an equivalent circuit of the active inductor according to the third preferred embodiment.
Figure 17:
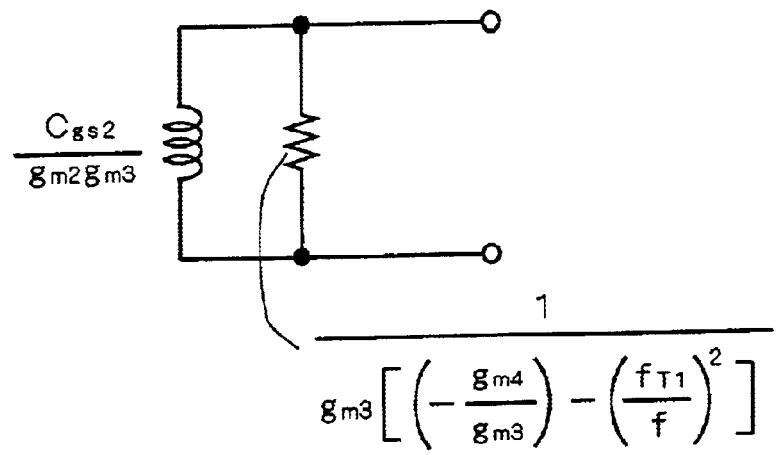

Current flowing in the active inductor 103 is indicated by I (let positive a direction the current flowing into a junction between the gate of the transistor M4 and the resistance R). The transistor M4 has a transconductance of $g_{m4}$, and a capacitor which parasites between the source and gate of the transistor M4 is indicated by $C_{gs4}$, with the equivalent circuit shown in FIG. 24 employed. Then, an equivalent circuit of the active inductor 104 is shown in FIG. 16.

The drain voltage of the transistor M4 is indicated by V relative to the gate of the transistor M4, and its angular frequency is indicated by ω (=2πf: f represents frequency). The equation $V=-V_{gs3}=-V_{gs4}$ is satisfied. Current flowing from the source of the transistor M1 into the resistor R is indicated by $I_R$. The currents I and $I_R$ are set to flow independently of each other as above described, so that a current does not flow continuously through the junction between the source of the transistor M3 and the source of the transistor M4. Thus, the following equations hold:

$$I+I_R=-g_{m4}V$$
$$I_R=(g_{m1}+j\omega C_{gs1})$$
$$j\omega C_{gs1}V_{gs1}=-g_{m2}V_{gs2} \quad (15)$$
$$j\omega C_{gs2}V_{gs2}=g_{m3}V$$

where the first to fourth equations are satisfied at nodes N1 to N4 shown in FIG. 15, respectively. Accordingly, an admittance between the gate and the drain of the transistor M4 viewed from the outside is expressed as follows:

$$Y = \frac{g_{m2}g_{m3}}{j\omega C_{gs2}} + g_{m3}\left[\left(-\frac{g_{m4}}{g_{m3}}\right) - \frac{g_{m1}g_{m2}}{\omega^2 C_{gs1}C_{gs2}}\right] \quad (16)$$

That is, the equivalent circuit of the active inductor 104 do not depend upon the resistance value R. Therefore, similarly to the first preferred embodiment, the resistor R may be replaced on the feedback path between the source of the transistor M1 and the drain of the transistor M4 with another two-port element, e.g., a capacitive element and/or an inductive element, and further, with the transistor Mf as in the modification shown in FIG. 8.

Introducing the expression (9), the above equivalent circuit is represented as a parallel connection of an inductor having a value of $C_{gs2}/(g_{m2}g_{m3})$ and a resistor having a value of $g_{m3}^{-1}[(-g_{m4}/g_{m3})-(f_{T1}/f)^2]^{-1}$ as shown in FIG. 7.

Taking the reciprocal of the expression (16), an impedance between the gate and the drain of the transistor M4 viewed from the outside is expressed as follows:

$$Z = \frac{1}{g_{m3}} \cdot \frac{j \cdot 2\pi f\left(\frac{C_{gs2}}{g_{m2}}\right)}{1 + j \cdot 2\pi f\left(\frac{C_{gs2}}{g_{m2}}\right)\left[\left(-\frac{g_{m4}}{g_{m3}}\right) - \left(\frac{f_{T1}}{f}\right)^2\right]} \quad (17)$$

Figure 18:
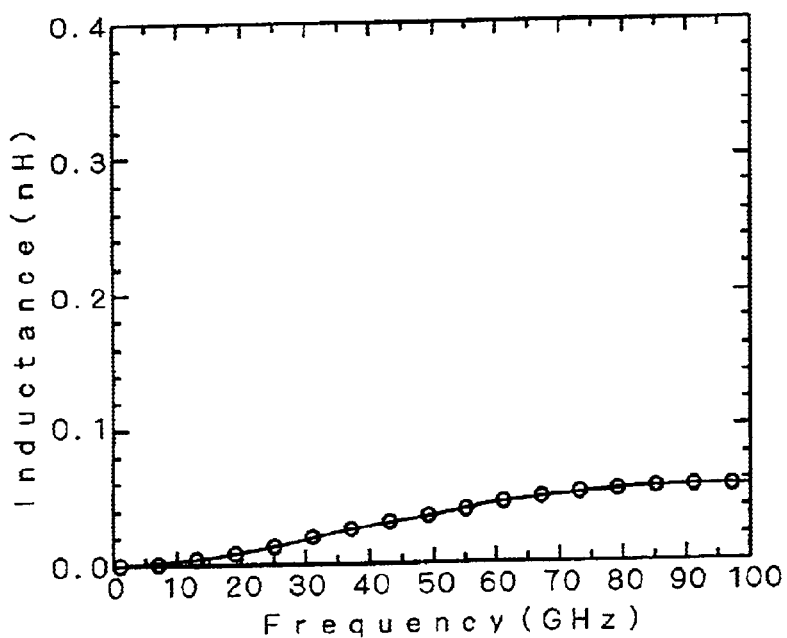
FIG. 18 is a graph showing an inductance component of the active inductor according to the third preferred embodiment.
Figure 19:
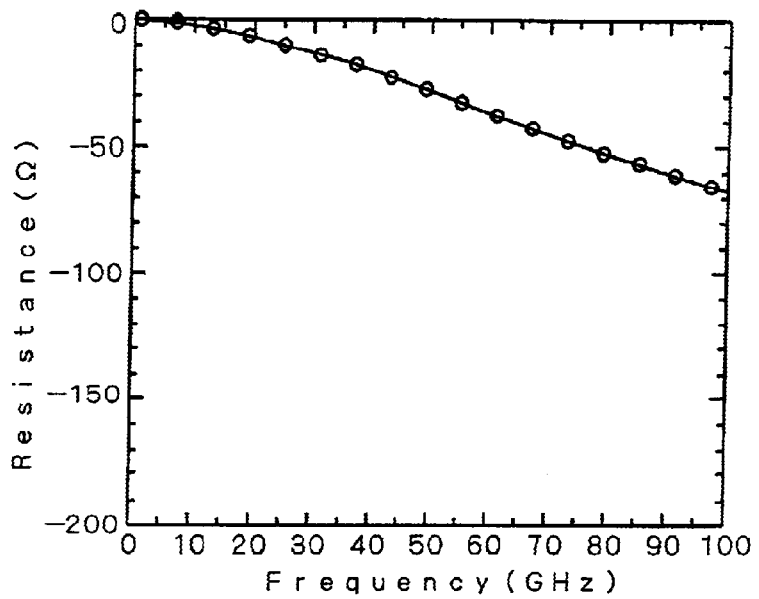
FIG. 19 is a graph showing a series resistance component of the active inductor according to the third preferred embodiment.

FIGS. 18 and 19 are graphs showing the results of simulation performed based on the expression (17) and indicating an inductance component and a serial resistance component of the active inductor 104, respectively. Here, transconductances $g_{m1}$, $g_{m2}$, $g_{m3}$ and $g_{m4}$ of the transistors M1 to M4 are set to 600 mS, and parasitic capacitors $C_{gs1}$, $C_{gs2}$, $C_{gs3}$ and $C_{gs4}$ are set to 9.6 fF. Similarly to the second preferred embodiment, anti-resonance frequencies $f_{T1}$ and $f_{T2}$ are approximately 100 GHz. For instance, the gate length and gate width are 0.1 μm and 10 μm, respectively, and a gate insulation film has a thickness equivalent to 1.8 nm of a silicon oxide film in respect to the dielectric constant.

As shown in FIG. 18, the inductance component characteristically becomes substantially flat in the vicinity of 100

GHz. An inductance value which falls within a variation of −10% of an inductance value at 100 GHz can be obtained in the range from 68 to 100 GHz (32 GHz band).

As shown in FIG. 19, the resistance component has a negative value, the absolute value of which increases as the frequency increases similarly to the second preferred embodiment. Thus, connecting the resistor in series from the outside enables to minimize loss.

Figure 20:
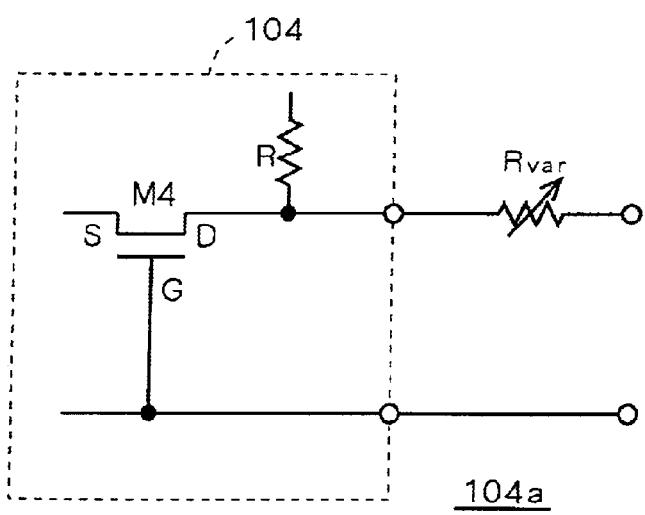
FIG. 20 is a circuit diagram showing a construction of an active inductor according to a modification of the second preferred embodiment.

FIG. 20 exemplifies a circuit in which a variable resistor $R_{var}$ is connected in series to the active inductor 104. Such a series connection of the active inductor 104 and the variable resistor $R_{var}$ can also be considered as an active inductor 104a.

Controlling the size of each transistor, in particular, the size of the transistors M3 and M4 added in the active inductor 101 to form the active inductors 103 and 104, respectively, enables to control values of the inductance component and the series resistance component as well as their frequency characteristics. As shown in the equations (16) and (17), the parasitic capacitors $C_{gs3}$ and $C_{gs4}$ do not affect the characteristics of the present embodiment. Consequently, the size of the transistors M3 and M4 can be designed without taking the parasitic capacitors $C_{gs3}$ and $C_{gs4}$ into account, thereby controlling the transconductances $g_{m3}$ and $g_{m4}$.

Figure 21:
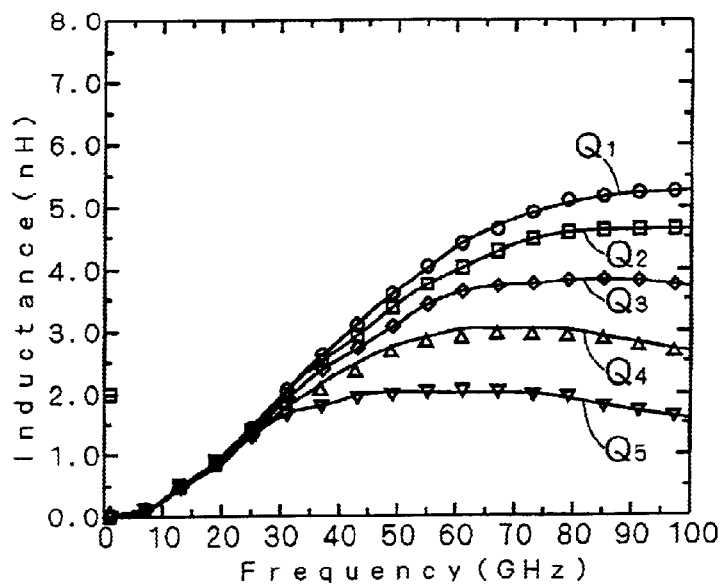
FIG. 21 shows graphs indicating inductance components of the active inductor according to the modification of the third preferred embodiment.
Figure 22:
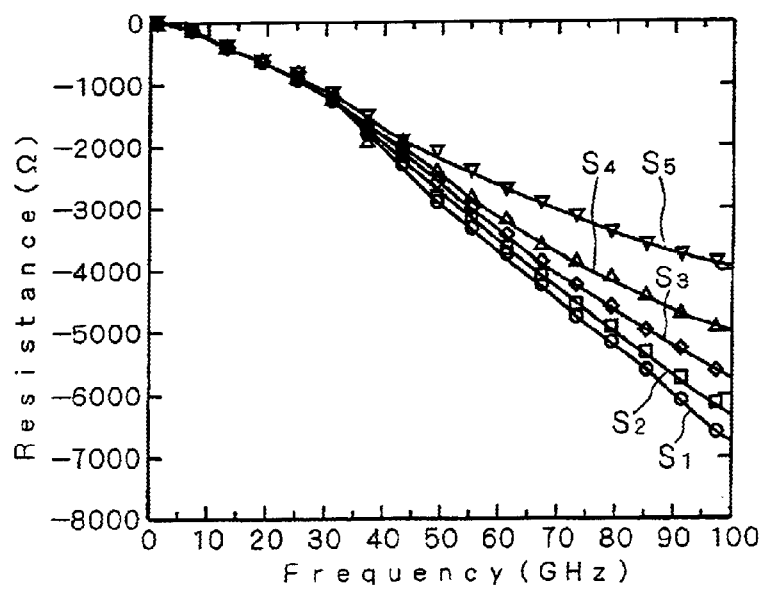
FIG. 22 shows graphs indicating series resistance components of the active inductor according to the modification of the third preferred embodiment.

FIGS. 21 and 22 show the case where the transconductance $g_{m4}$ is varied as a parameter, and indicate an inductance component and a series resistance component, respectively. The transconductance $g_{m3}$ is fixed to a value of 1% of the transconductances $g_{m1}$ and $g_{m2}$ of the transistors M1 and M2.

Referring to FIG. 21, graphs $Q_1$, $Q_2$, $Q_3$, $Q_4$ and $Q_5$ correspond to the cases where values of $g_{m4}/g_{m3}$ are 1, 1.2, 1.5, 2 and 3, respectively. A frequency band in which the inductance component successively changes in a range of 10% is 60–100 GHz when $g_{m4}/g_{m3}$=1; 55–100 GHz when $g_{m4}/g_{m3}$=1.2; 50–100 GHz when $g_{m4}/g_{m3}$=1.5; 44–100 GHz when $g_{m4}/g_{m3}$=2; and 36–92 GHz when $g_{m4}/g_{m3}$=3. Accordingly, the bandwidth may be increased more than in a conventional case. The inductance value itself decreases as a value of $g_{m4}/g_{m3}$ increases.

Referring to FIG. 22, graphs $S_1$, $S_2$, $S_3$, $S_4$ and $S_5$ correspond to the cases where values of $g_{m4}/g_{m3}$ are 1, 1.2, 1.5, 2 and 3, respectively. The absolute value of the series resistance component also decreases as a value of $g_{m4}/g_{m3}$ increases.

While the invention has been shown and described in detail, the foregoing description is in all aspects illustrative and not restrictive. It is therefore understood that numerous modifications and variations can be devised without departing from the scope of the invention.

What is claimed is:

1. An active inductor comprising first and second field effect transistors, each having a source, a gate and a drain, wherein
    said drain of said first field effect transistor is connected to said source of said second field effect transistor,
    said gate of said first field effect transistor is connected to said drain of said second field effect transistor with no active element interposed therebetween,
    said active inductor further comprising a feedback path provided between said source of said first field effect transistor and said gate of said second field effect transistor, wherein
    said gate and said source of said second field effect transistor serve as two ports of said active inductor, and
    a field effect transistor for feedback provided on said feedback path, having a source connected to said source of said first field effect transistor, a gate and a drain connected to each other and to one of said two ports of said inductor.

2. An active inductor comprising first and second field effect transistors, each having a source, a gate and a drain, wherein
    said drain of said first field effect transistor is connected to said source of said second field effect transistor,
    said gate of said first field effect transistor is connected to said drain of said second field effect transistor with no active element interposed therebetween,
    said active inductor further comprising a feedback path provided between said source of said first field effect transistor and said gate of said second field effect transistor, wherein
    said gate and said source of said second field effect transistor serve as two ports of said active inductor, and
    further comprising a resistor for feedback provided on said feedback path.

3. An active inductor comprising first and second field effect transistors, each having a source, a gate and a drain, wherein
    said drain of said first field effect transistor is connected to said source of said second field effect transistor,
    said gate of said first field effect transistor is connected to said drain of said second field effect transistor with no active element interposed therebetween,
    said active inductor further comprising a feedback path provided between said source of said first field effect transistor and said gate of said second field effect transistor, wherein
    said gate and said source of said second field effect transistor serve as two ports of said active inductor, and
    further comprising a second capacitor interposed between said gate of said first field effect transistor and said drain of said second field effect transistor.

4. The active inductor according to claim 3, further comprising a third capacitor interposed between said drain of said first field effect transistor and said gate of said second field effect transistor.

5. The active inductor according to claim 4, further comprising a fourth capacitor provided on said feedback path.

6. The active inductor according to claim 3, further comprising a fourth capacitor provided on said feedback path.

* * * * *